United States Patent
Haller et al.

(10) Patent No.: US 12,317,378 B2
(45) Date of Patent: May 27, 2025

(54) MULTI-ZONE HEATER CONTROL FOR WAFER PROCESSING EQUIPMENT

(71) Applicant: Applied Materials, Inc., Santa Clara, CA (US)

(72) Inventors: Uwe P. Haller, San Jose, CA (US); Kiyki-Shiy N. Shang, Mountain House, CA (US); Dmitry A. Dzilno, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 583 days.

(21) Appl. No.: 17/167,904

(22) Filed: Feb. 4, 2021

(65) Prior Publication Data
US 2022/0248500 A1    Aug. 4, 2022

(51) Int. Cl.
*H05B 1/02*     (2006.01)
*H01J 37/32*    (2006.01)
*H02M 1/10*     (2006.01)

(52) U.S. Cl.
CPC ...... *H05B 1/0233* (2013.01); *H01J 37/32724* (2013.01); *H02M 1/10* (2013.01)

(58) Field of Classification Search
CPC .... H01J 37/32724; H02M 1/007; H02M 1/10; H02M 7/003; H02M 7/06; H02M 7/5387; H05B 1/0233; H05B 2203/014; H05B 3/265
USPC .......................................... 219/443.1–444.1
See application file for complete search history.

(56) References Cited

U.S. PATENT DOCUMENTS

| | | | | |
|---|---|---|---|---|
| 4,143,414 A | * | 3/1979 | Brewster | H02M 7/523 363/27 |
| 2013/0105457 A1 | * | 5/2013 | Swanson | H05B 1/00 219/209 |
| 2016/0293456 A1 | * | 10/2016 | Okita | H01L 21/6836 |
| 2017/0186592 A1 | | 6/2017 | Ni et al. | |
| 2018/0374763 A1 | | 12/2018 | Gaff et al. | |

(Continued)

FOREIGN PATENT DOCUMENTS

| | | |
|---|---|---|
| JP | 11126743 A | 5/1999 |
| JP | 2000332089 A | 11/2000 |
| KR | 20120103596 A | 9/2012 |

OTHER PUBLICATIONS

Application No. PCT/US2022/015012, International Search Report and Written Opinion, Mailed On May 23, 2022, 11 pages.

*Primary Examiner* — Sang Y Paik
(74) *Attorney, Agent, or Firm* — Kilpatrick Townsend & Stockton LLP

(57) ABSTRACT

A method of providing power to a plurality of heaters in multiple zones for wafer-processing equipment may include causing a voltage to be supplied to a plurality of power leads configured to supply the voltage to a plurality of different heating zones in a pedestal, causing current to be received from the plurality of different heating zones through a return lead that is shared by the plurality of power leads, and causing a polarity of the voltage provided to the plurality of power leads to switch. The switching frequency may be configured such that a DC chucking operation can be active at the same time to hold a substrate to the pedestal. Duty cycling the heating zones that share the return lead may minimize the current through the shared return lead.

20 Claims, 13 Drawing Sheets

(56) References Cited

U.S. PATENT DOCUMENTS

2019/0371577 A1* 12/2019 Benjaminson .... H01L 21/68735
2020/0411339 A1* 12/2020 Endo .................... H05B 1/0233

* cited by examiner

MULTI-ZONE HEATER CONTROL FOR WAFER PROCESSING EQUIPMENT

TECHNICAL FIELD

This disclosure generally relates to systems and methods for controlling heating elements in a pedestal for wafer-processing equipment. More specifically, this disclosure discusses systems and methods for controlling a plurality of heating zones with a shared return lead and switching voltage polarities.

BACKGROUND

In the manufacture of integrated circuits and other electronic devices, plasma processes are often used for deposition or etching of various material layers. Plasma-enhanced chemical vapor deposition (PECVD) process is a chemical process wherein electro-magnetic energy is applied to at least one precursor gas or precursor vapor to transform the precursor into a reactive plasma. Plasma may be generated inside the processing chamber, i.e., in-situ, or in a remote plasma generator that is remotely positioned from the processing chamber. This process is widely used to deposit materials on substrates to produce high-quality and high-performance semiconductor devices.

Transistor structures have become increasingly complicated and challenging as feature size continues to decrease. To meet processing demands, advanced processing control techniques are useful to control cost and maximize substrate and die yield. Normally, the dies at certain locations of the substrate suffer yield issues when the plasma is not controlled uniformly across the surface area of the substrate. On the substrate processing level, there is a need for advancements in process uniformity control to allow fine, localized process tuning as well as global processing tuning across the whole substrate when controlling the temperature of the substrate. Therefore, there is a need for methods and apparatus to allow fine, localized process tuning and temperature control throughout the entirety of the substrate.

SUMMARY

In some embodiments, a multi-zone heater control system for wafer-processing chambers may include a plurality of power leads configured to supply a voltage to a plurality of different heating zones in a pedestal; a return lead that is shared by the plurality of power leads; a plurality of switches that are configured to switch a polarity of the voltage provided to the plurality of power leads.

In some embodiments, a method of providing power to a plurality of heaters in multiple zones for wafer-processing equipment may include causing a voltage to be supplied to a plurality of power leads configured to supply the voltage to a plurality of different heating zones in a pedestal; causing current to be received from the plurality of different heating zones through a return lead that is shared by the plurality of power leads; and causing a polarity of the voltage provided to the plurality of power leads to switch.

In some embodiments, a multi-zone heater control system for wafer-processing chambers may include an input for a 3-phase power supply; a 3-phase rectifier configured to convert a signal from the 3-phase power supply into a DC signal; a first plurality of power leads configured to provide a first power to a first plurality of heating zones in a pedestal where the first power may be derived from the DC signal; a first return lead that is shared by the first plurality of power leads; a second plurality of power leads configured to provide a second power to a second plurality of heating zones in the pedestal, where the second power may be derived from the DC signal; and a second return lead that is shared by the second plurality of power leads.

In any embodiments, any and all of the following features may be implemented in any combination and without limitation. The system may include a plurality of DC chucking leads configured to provide a voltage differential to the pedestal to hold a substrate to the pedestal during a processing operation. The system may also include a control circuit that provides control signals to the plurality of switches, where the control circuit may cause the plurality of switches to switch the polarity of the voltage at a frequency that does not interfere with the DC chucking. The frequency may be between approximately 50 Hz and approximately 100 Hz. The plurality of switches may include a first switch and a second switch, where the first switch may connect a power lead in the plurality of power leads to a first voltage reference, and the second switch may connect the power lead to a second voltage reference. The plurality of switches may include a third switch and a fourth switch, where the third switch may connect the return lead to the second voltage reference, and the fourth switch may connect the return lead to the first voltage reference. The plurality of heating zones may include inner, middle, and outer heating zones on the pedestal configured to use more than 1 kW of power. The plurality of heating zones may include at least four heating zones positioned around a periphery of the pedestal that are configured to use less than 250 W of power. The system may further include a circuit that measures a resistance of a heating element associated with one of the plurality of heating zones, and a controller that populates a table that relates temperature in the heating element to resistances measured by the circuit. The method/operations of the system may also include causing the voltage provided to the plurality of power leads to switch between a negative voltage and a positive voltage. The method/operations of the system may also include duty cycling each of the plurality of different heating zones in the pedestal such that only one of the plurality of different heating zones are active at a time. The method/operations of the system may also include duty cycling each of the plurality of different heating zones to provide a time interval during which resistance measurements are made on the plurality of power leads and during which none of the plurality of different heating zones are active. The method/operations of the system may also include duty cycling each of the plurality of different heating zones in the pedestal such that only two of the plurality of different heating zones are active at a time. The system may also include one or more DC converters that may convert the DC signal into the first power and the second power; and a transformer that may be part of the one or more DC converters that may isolate the 3-phase rectifier from the first plurality of power leads and the second plurality of power leads. The system may also include an interface that receives commands for providing the first power and the second power; a controller configured to cause a polarity of a voltage provided to the first plurality of power leads to switch; and/or a controller configured to duty cycle the first power provided to each of the first plurality of power leads.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

Figure 1:
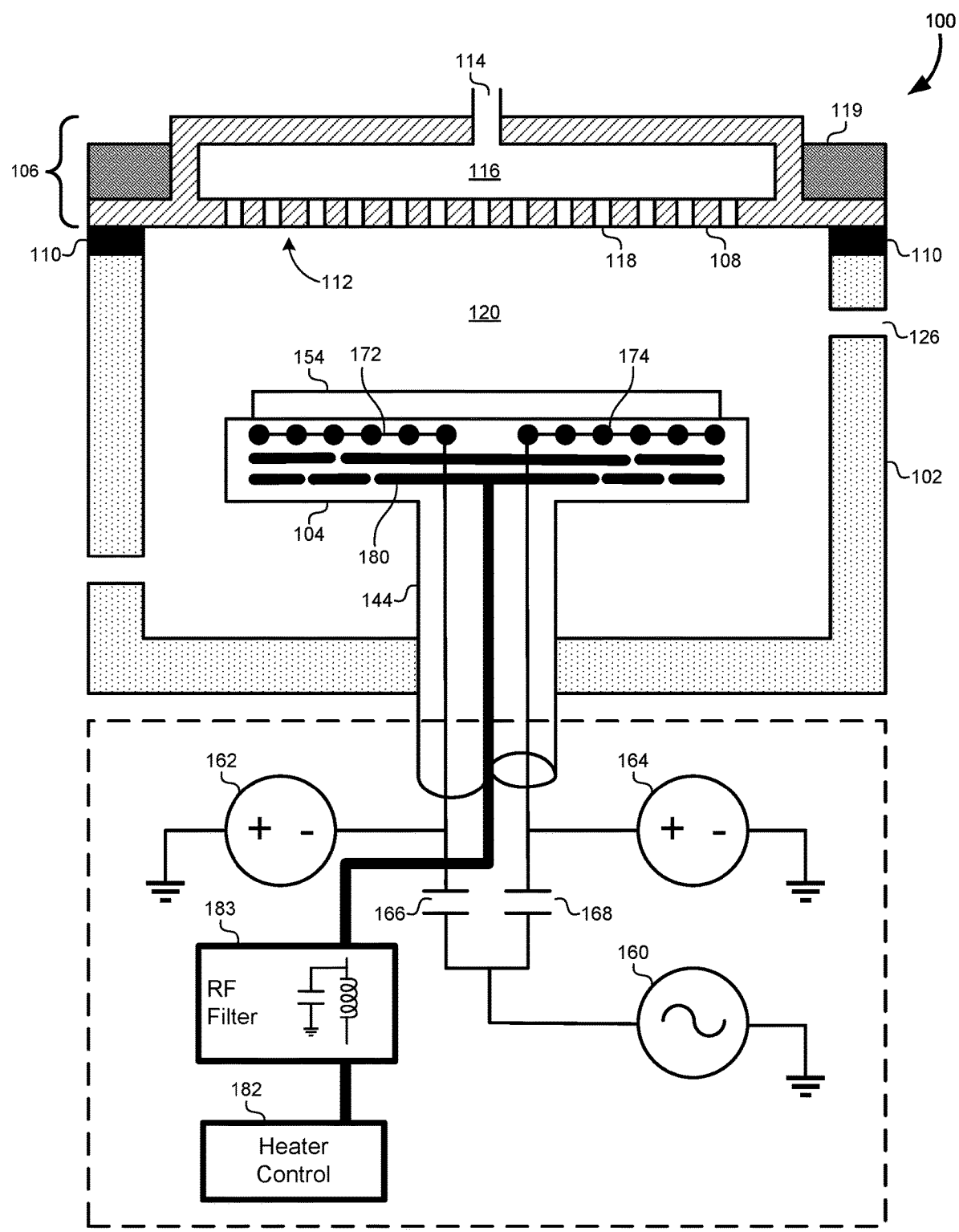
FIG. 1 illustrates a cross-sectional view of a processing chamber 100, according to some embodiments. The figure is overall ok, but there is a description issue.

FIG. 1 illustrates a cross-sectional view of a wafer-processing chamber 100, according to some embodiments. As shown, the processing chamber 100 may be an etch chamber suitable for etching a substrate 154 or for performing other wafer manufacturing operations. Examples of processing chambers that may be adapted to benefit from the embodiments describe herein may include the Producer® Etch Processing Chamber, and the Precision™ Processing Chamber, commercially available from Applied Materials, Inc., located in Santa Clara, California. It is contemplated that other processing chambers, including those from other manufacturers, may be adapted to benefit from these embodiments.

The processing chamber 100 may be used for various plasma processes. For example, the processing chamber 100 may be used to perform dry etching with one or more etching agents. The processing chamber may be used for ignition of plasma from a precursor $C_xF_y$ (where x and y represent values for known compounds), $O_2$, $NF_3$, or combinations thereof. In another example, the processing chamber 100 may be used for a plasma-enhanced chemical vapor deposition (PECVD) process with one or more precursors.

The processing chamber 100 may include a chamber body 102, a lid assembly 106, and a pedestal 104. The lid assembly 106 is positioned at an upper end of the chamber body 102. The pedestal 104 may be disposed inside the chamber body 102, and the lid assembly 106 may be coupled to the chamber body 102 and enclose the pedestal 104 in a processing volume 120. The chamber body 102 may include a transfer port 126, which may include a slit valve, formed in a sidewall of the chamber body 102. The transfer port 126 may be selectively opened and closed to allow access to an interior of the processing volume 120 by a substrate handling robot (not shown) for substrate transfer.

An electrode 108 may be provided as a portion of the lid assembly 106. The electrode 108 may also function as a gas distributor plate 112 having a plurality of openings 118 for admitting process gas into the processing volume 120. The process gases may be supplied to the processing chamber 100 via a conduit 114, and the process gases may enter a gas mixing region 116 prior to flowing through the openings 118. The electrode 108 may be coupled to a source of electric power, such as an RF generator, DC power, pulsed DC power, pulsed RF, and/or the like. An isolator 110 may contact the electrode 108 and separate the electrode 108 electrically and thermally from the chamber body 102. The isolator 110 may be constructed using a dielectric material such aluminum oxide, aluminum nitride, and/or other ceramics or metal oxides. A heater 119 may be coupled to the gas distributor plate 112. The heater 119 may also be coupled to an AC power source.

The pedestal 104 may be coupled to a lift mechanism through a shaft 144, which extends through a bottom surface of the chamber body 102. The lift mechanism may be flexibly sealed to the chamber body 102 by a bellows that prevents vacuum leakage from around the shaft 144. The lift mechanism may allow the pedestal 104 to be moved vertically within the chamber body 102 between a transfer position and a number of process positions to place the substrate 154 in proximity to the electrode 108.

The pedestal 104 may be formed from a metallic or ceramic material. For example, a metal oxide, nitride, or oxide/nitride mixture may be used such as aluminum, aluminum oxide, aluminum nitride, an aluminum oxide/nitride mixture, and/or other similar materials. In typical implementations, one or more pedestal electrodes may be included in the pedestal 104. For example, a first pedestal electrode 172 and a second pedestal electrode 174 may be provided in the pedestal 104. The first pedestal electrode 172 and the second pedestal electrode 174 may be embedded within the pedestal 104 and/or coupled to a surface of the pedestal 104. The first pedestal electrode 172 and the second pedestal electrode 174 may be a plate, a perforated plate, a mesh, a wire screen, or any other distributed conductive arrangement. Although FIG. 1 illustrates only two pedestal electrodes, other embodiments may use more than two pedestal electrodes having different geometries and/or arrangements in the pedestal 104 as described in detail below.

The one or more pedestal electrodes may be configured to deliver RF energy to a plasma in the processing volume 120. For example, an RF source 160 may be provided outside of the chamber body 102 to provide RF energy to one or more pedestal electrodes in the pedestal 104. The RF energy may be transferred through the one or more pedestal electrodes to a gas in the processing volume 120 that is deposited through the gas distributor plate 112 (also referred to as a "showerhead") to generate a plasma. The plasma may be maintained above the substrate 154 to deposit a layer of material on the substrate 154. In order to uniformly deposit material on the substrate 154, the energy transferred to the plasma should be maintained uniformly across the surface area of the substrate 154.

A method known as bipolar chucking may be used with a first pedestal electrode 172 and a second pedestal electrode 174. Bipolar chucking is a method of applying a DC voltage difference between the first pedestal electrode 172 and the second pedestal electrode 174. This electrostatic difference serves to hold the substrate 154 to the pedestal 104. This may be contrasted with monopolar chucking where only a single pedestal electrode is used, or where a DC voltage is only applied to a single pedestal electrode. Monopolar chucking only becomes effective when energy is applied to the plasma to complete the circuit. Bipolar chucking uses two separate electrical paths to each of the first pedestal electrode 172 and the second pedestal electrode 174. In the example of FIG. 1, a first DC voltage source 162 is applied to a first electrical pathway for the first pedestal electrode 172. A second DC voltage source 164 is applied to a second electrical pathway for the second pedestal electrode 174. Some embodiments may include one or more capacitors 166, 168 to isolate the DC voltage sources 162, 164 from each other and/or to the voltage source 160. In some embodiments, each of the capacitors 166, 168 may be relatively large, such as 50 nF to block the DC voltage.

In addition to the one or more pedestal electrodes 172, 174, some embodiments may also include one or more heating elements 180 in the pedestal 104. The one or more heating elements 180 may include wires with a relatively low internal resistance that generate heat when an electrical current is run through the one or more heating elements 180. For example, some heating elements may have a resistance of less than 10 ohms, such as 2 ohms. Power may be provided to the one or more heating elements 180 by a heater control 182. The heater control 182 may provide voltage/current to the one or more heating elements 180 during a processing cycle to heat the pedestal 104. This heat may be transferred to the substrate 154 to bring the substrate 154 into a predetermined temperature range during the process.

In some embodiments, an RF filter 183 may be included between the heater control 182 and the one or more heating elements 180. The RF filter may prevent RF signals from leaking into the AC network. The RF filter 183 may include a plurality of inductor/capacitor combinations for each input and/or output lead to/from the heater control 182. For example, each individual RF filter in the RF filter 183 may include a parallel capacitance (e.g., approximately 50 nF) and a series inductor (e.g., approximately 6 pH) to filter out RF signals on each of these lines. In total, some embodiments may include a total of nine rods or leads from the pedestal 104, including two high-voltage leads for chucking, and seven leads for different heater zones. In the seven-zone configuration described herein, zones 1-3 may share a common return rod, and zones 4-7 may share a common return rod.

A number of technical problems exist for providing controlled temperature profiles to the substrate 154. When using a single heating element, the temperature profile of the substrate 154 may be non-uniform. For example, temperatures may be higher in the center of the substrate 154 than temperatures at the periphery of the substrate 154. In another example, the temperature profile may resemble an "M" shape, with lower temperatures in the center and periphery of the substrate 154 and higher temperatures between the middle of the substrate 154 and the periphery of the substrate 154. Modern substrate processes are beginning to require tighter temperature control, which often may benefit from a uniform temperature profile across the substrate 154. Other processes may benefit from programmable temperature profiles that decrease/increase temperature according to a predetermined temperature profile that can be monitored and adjusted in real time as the process is executed.

To tightly control the temperature profile on the substrate 154, a plurality of heating elements may be used in the pedestal 104. However, introducing a plurality of heating elements also introduces additional technical problems. Because of the low resistance associated with the wires of the heating elements, each additional heating element may increase the current requirements of the heater control 182. This not only increases the current required to power the heating elements, but it also increases the current running through internal circuits of the heater control 182. For example, an RF filter may include an inductor that used in the heater control 182 to prevent an RF signal from the RF source 160 from interfering with the heater control 182. As current through the inductor increases, the heat generated in the inductor may also increase proportionally. This may result in damage to the internal circuitry of the filter and/or may generate excessive heat in the electronics controlling the processing chamber 100.

The embodiments described herein solve these and other technical problems by providing a heater control 182 that can efficiently provide power to multiple different heating elements in the pedestal 104. These embodiments may be configured to provide power for high-power heating elements, as well as low-power heating elements that may be used to fine-tune the temperature profile across the substrate 154. This heater control 182 may share return wires to minimize the number of leads from the pedestal 104. The heater control 182 may also duty cycle the various heating elements in order to maintain an acceptable level of current running through the shared return lead. Some embodiments may also switch the polarity of the heating elements such that the voltage differential across the heating elements does not interfere with the DC bipolar chucking of the substrate 154.

Figure 2A:
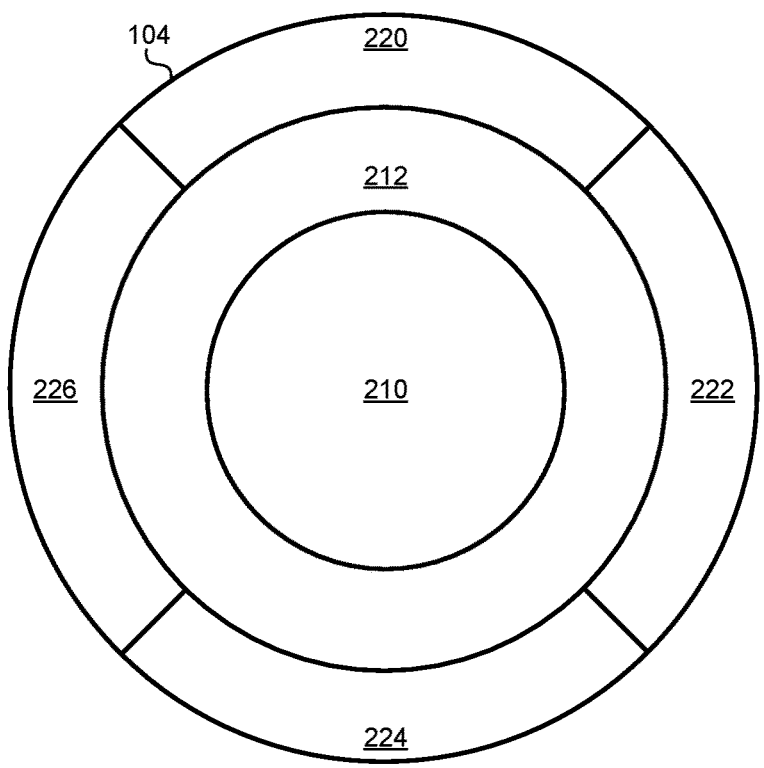
FIGS. 2A-2B illustrate a pedestal with a plurality of heating elements arranged in different heating zones, according to some embodiments.
Figure 2B:
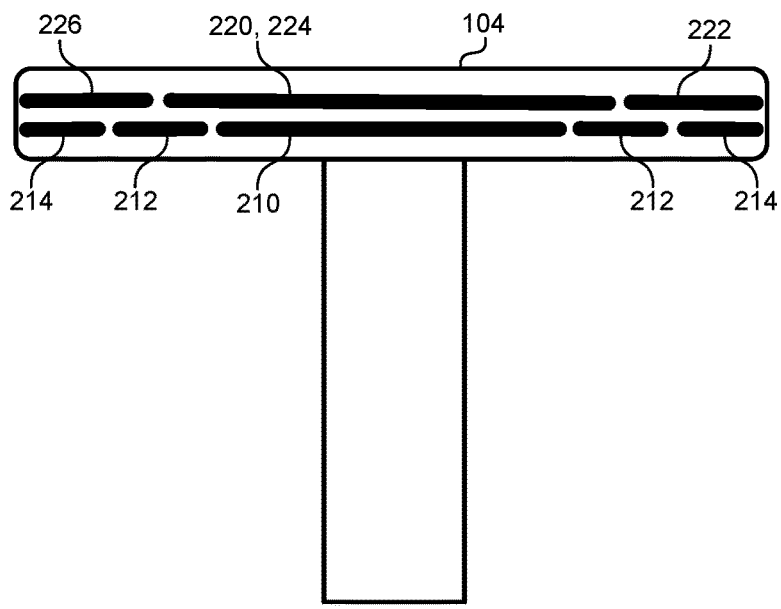

FIGS. 2A-2B illustrate a pedestal 104 with a plurality of heating elements arranged into different heating zones, according to some embodiments. In this example, the plurality of heating elements may include seven separate and distinct heating elements. Note that this arrangement and the number of heating elements is provided only by way of example and is not meant to be limiting. The heater control described herein may be used with any number of heating elements. Furthermore, the heating control may be compatible with different arrangements of heating element types. As described below, the heater control may include leads that are compatible with high-power heating elements and low-power heating elements interchangeably.

In this example, the pedestal 104 may include a number of high-powered heating elements that are arranged in concentric circular areas on the pedestal 104. A center or inner heating element 210 may have a disk or circular shape and be centered in the pedestal 104. A middle heating element 212 may have a ring shape and may be positioned concentrically around the inner heating element 210. An outer heating element 214 may also have a ring shape and may be positioned concentrically around the middle heating element 212. These heating elements 210, 212, 214 may be configured to receive current from the heater control such that they can generate heat in the kilowatt range. These heating elements 210, 212, 214 may be used to set the primary temperature of the substrate. For example, to heat the substrate to temperatures of around 300° C. to around 800° C., the processing chamber may rely on these heating elements 210, 212, 214 with higher power ranges to provide the primary heat for heating the substrate to this temperature range.

This example may also include a number of low-power heating elements that are arranged around a periphery of the pedestal 104. The periphery of the pedestal 104 may be divided into quadrants, and a heating element may be located and shaped to cover each of the quadrants. For example, heating element 220, heating element 222, heating element 224, and heating element 226 may be arranged around the periphery. These heating elements may be arranged in a ring that may be similar in diameter to the outer heating element 214. In the cross-sectional view of the pedestal 104, these low-power heating elements 220, 222, 224, 226 may be placed on top of the high-power heating elements 210, 212, 214, or vice versa. The low-power heating elements 220, 222, 224, 226 may be used to fine-tune the temperature profile in specific areas of the pedestal 104. Note that the specific geometry and arrangement of the low-power heating elements 220, 222, 224, 226 are provided only by way of example and are not meant to be limiting. The low-power heating elements 220, 222, 224, 226 may use power that is less than 100 W, such as between approximately 10 W and approximately 40 W. Other embodiments may include more or fewer low-power heating elements, which may be located in any of the middle, inner, and/or outer regions of the pedestal 104.

Figure 3:
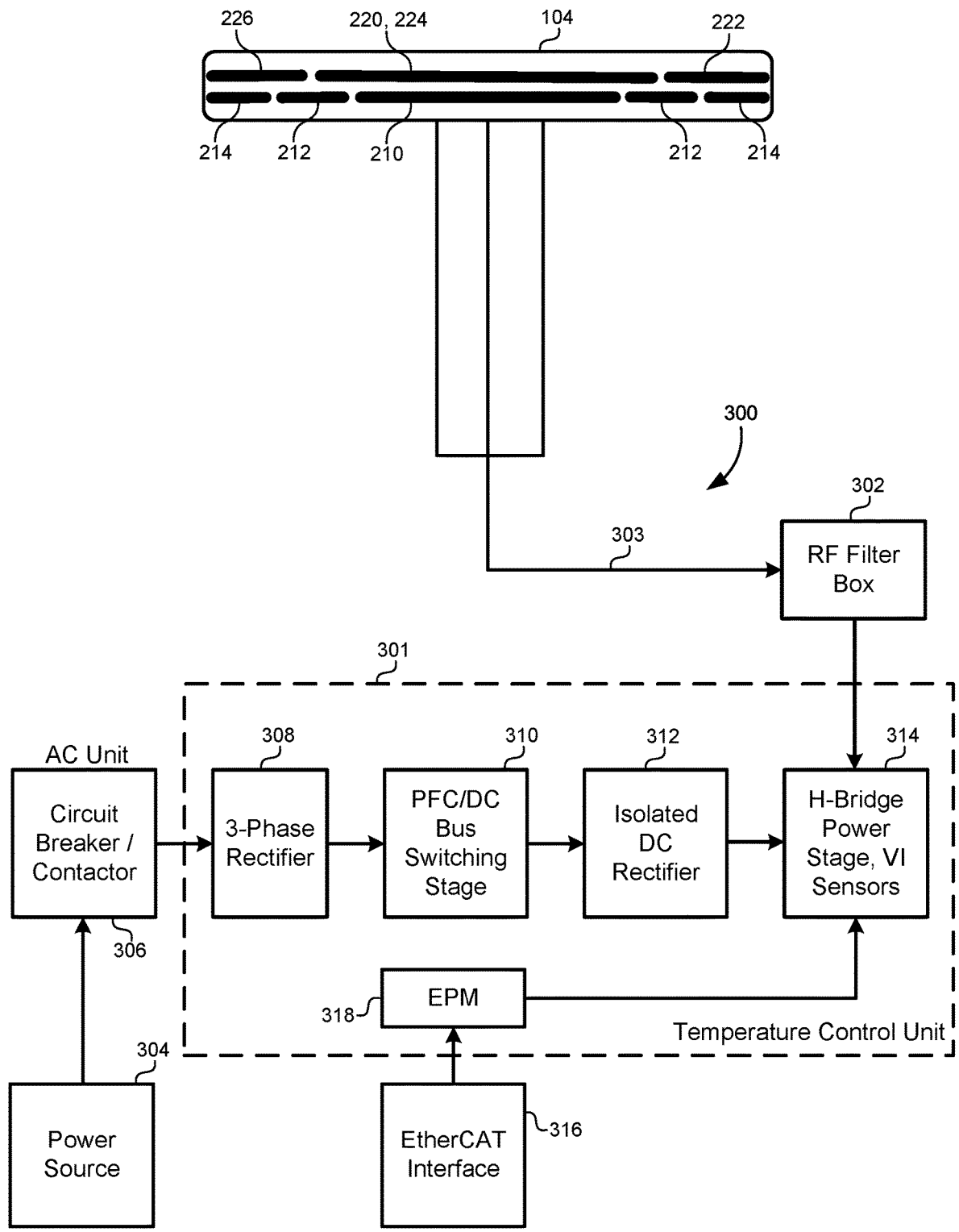
FIG. 3 illustrates a heater control for the pedestal, according to some embodiments.

FIG. 3 illustrates a multi-zone heater control system for the wafer-processing chamber, according to some embodiments. The heater control may include a plurality of leads 303 that are electrically coupled to the plurality of heating elements in the pedestal 104 as described above. Each of the heating elements may be modeled as a wire with an internal resistance that generates heat in the pedestal 104. Therefore, basic implementations may use a power and return wire for each of the heating element. In the example above using seven distinct heating element, this would result in 14 different leads going to/from the pedestal 104 for the heating elements alone, along with at least two more leads for the DC chucking voltage.

Figure 4:
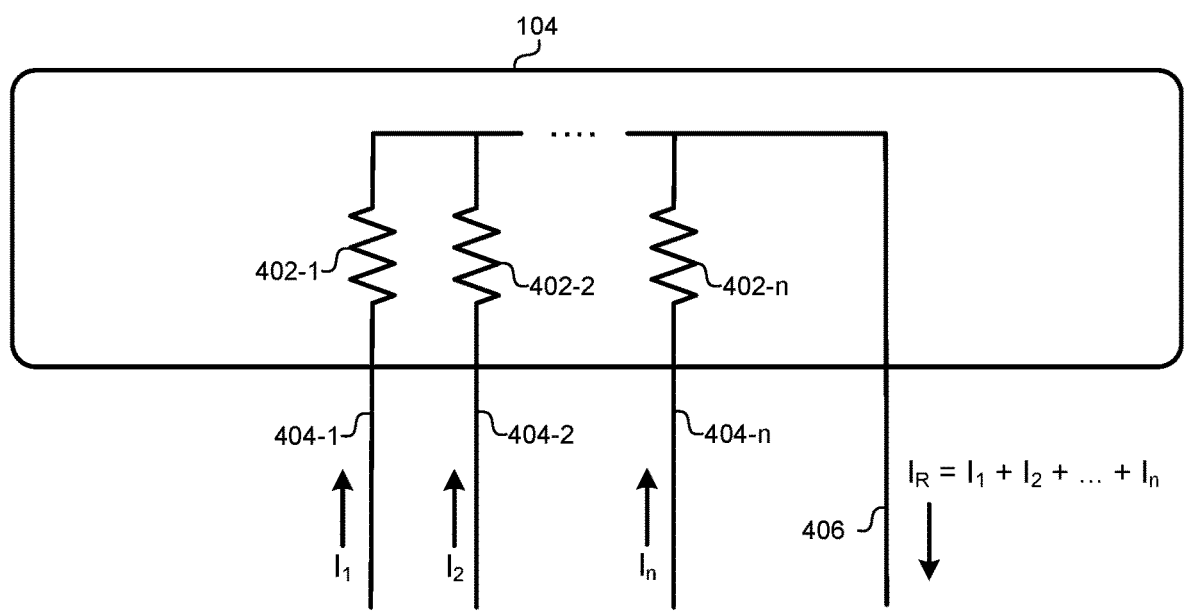
FIG. 4 illustrates a circuit for combining return leads for different heating elements, according to some embodiments.

FIG. 4 illustrates a circuit for combining return leads for different heating elements, according to some embodiments. In this example, the high-power heating elements in the inner, middle, and outer sections of the pedestal 104 may be modeled as resistances 402 in a circuit diagram. The resistances 402 may be connected to the heater control 300 through a plurality of power leads 404. In order to individually control each of the heating zones, each of the resistances 402 may be individually associated with one of the power leads 404. For example, power lead 404-1 may be used to deliver current to resistance 402-1 for the inner heating element, power lead 404-2 may be used to deliver current to resistance 402-2 for the middle heating element, and power lead 404-3 may be used to deliver current to resistance 402-3 for the outer heating element.

While each of the resistances 402 may be associated with individual wires in the power leads 404, each of these resistances 402 may also be associated with a shared return lead 406. Sharing a return lead improves the processing chamber by minimizing the number of electrical leads that need to be routed through the pedestal 104 and filtered from other RF/DC signals in the pedestal 104. However, when multiple heating zones share the same return lead 406, this may increase the instantaneous current that is routed through the return lead 406. As described below, this current may be filtered through an inductor and other circuit elements to remove RF signals that may be present in the pedestal 104. An excessive amount of current may overheat the inductor and other circuit elements and damage or degrade the operation of the processing chamber. A solution that reduces the instantaneous current through the shared return lead 406 is described below in relation to FIG. 8.

Turning back to FIG. 3, the plurality of leads 303 may be combined into two groups: one group of three power wires and one shared return wire for the high-power heating elements, and one group of four power wires and one shared return wire for the low-power heating elements, which reduces the total number of wire leads down to nine wire leads for the heater. An RF filter 302 may be provided to filter the RF signals that may be present in the pedestal 104. As described above, the pedestal 104 may also include multiple wire meshes that provide RF power to a plasma in the processing chamber. To prevent the RF signal from traveling down the leads 303 and into the heater control 300, the RF filter 302 may be configured to remove RF signals in the frequency range of the pedestal 104. The RF filter 302 may also be configured to remove low-frequency signals and provide a low, stable resistance for DC voltages that are applied to the heating elements. For example, the RF filter 302 may remove common frequencies found in the pedestal 104, such as 13.56 MHz, 27 MHz, 40 MHz, and so forth.

The heater control 300 may be connected to a power source 304, such as a 208 VAC 3-phase power supply. Other power supply voltages may also be compatible with the heater control 300. The 3-phase power from the power source 304 may pass through an AC unit 306 that includes one or more circuit breakers and/or contactors to interface the heater control 300 with the power from the power source 304. After passing through the AC unit 306, the 3-phase power may be rectified using a three-phase rectifier 308. A power factor correction circuit 310 may be used to maximize the real power provided to the circuit. The output of the power factor correction circuit 310 may be used to generate a DC bus voltage with galvanic isolation. An isolated DC rectifier 312 (e.g., a DC-DC converter, buck converter, boost converter, etc.) may be used to generate a stable DC voltage with good load and line regulation. The stable DC voltage may then be provided to an H-bridge power stage 314. The H-bridge power stage 314 may include a plurality of switches that control when the DC power is provided to each of the plurality of leads 303 extending into the pedestal 104. The switches may receive commands from a serial communication module 318 that is connected to a serial interface 316. A control computer or processor may provide commands through the serial interface 316 that controls the timing of the power provided to the heating element in the pedestal 104. Any serial communication protocol may be used, such as an EtherCAT connection. A computer system, local microprocessor, local state machine logic, or the serial communication module may be referred to herein as a controller or control circuit that is configured to provide control signals to the switching circuits described below. The timing and operation of the switches is described in greater detail below. Additionally, voltage and/or current sensors may be provided to perform a precision resistance measurement of each of the heating elements as described below. This precision resistance measurement may be used to measure temperature in the heating element, calibrate the heating element, and/or monitor operation of the heating elements over time.

Figure 5:
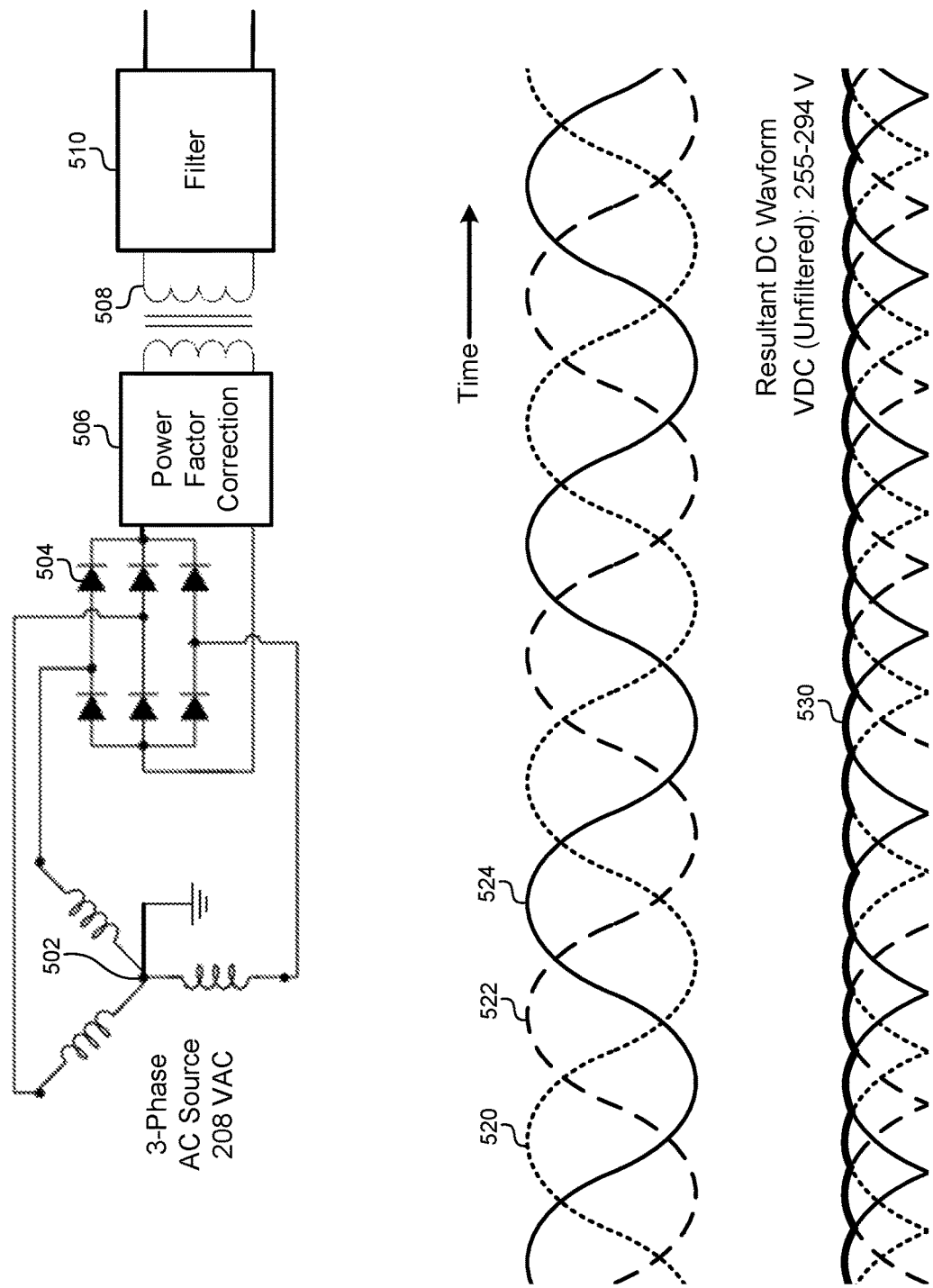
FIG. 5 illustrates an example circuit diagram for a portion of the heater control, according to some embodiments.

FIG. 5 illustrates an example circuit diagram for a portion of the heater control 300, according to some embodiments.

A 3-phase voltage source 502 may generate three voltage waveforms 520, 522, 524 that are phase-shifted 120° relative to each other. A rectifier 504 may be implemented using three pairs of diodes, and may generate a rectified voltage 530 as illustrated in FIG. 5 having an average voltage of between approximately 255 V and 294 V. The rectified voltage may pass through the power factor correction circuit 560 before passing through a transformer 508. The transformer 508 may either step-up or step-down the DC voltage. This ensures that there is no DC leakage from the rest of the circuit into the rectifier 504. The filter 510 may be configured to remove RF signals as described above. The transformer 508 may be part of a DC/DC converter (e.g., a buck converter, a boost converter, etc.) in order to provide galvanic isolation and reduce the volume/rating by using the high switching frequencies of the DC/DC converter, which may operate in the 100's of kHz. The transformer 508 is shown separate from the DC/DC converter in this embodiment, while other embodiments (not shown) may incorporate the transformer 508 into the DC/DC converter.

Figure 6:
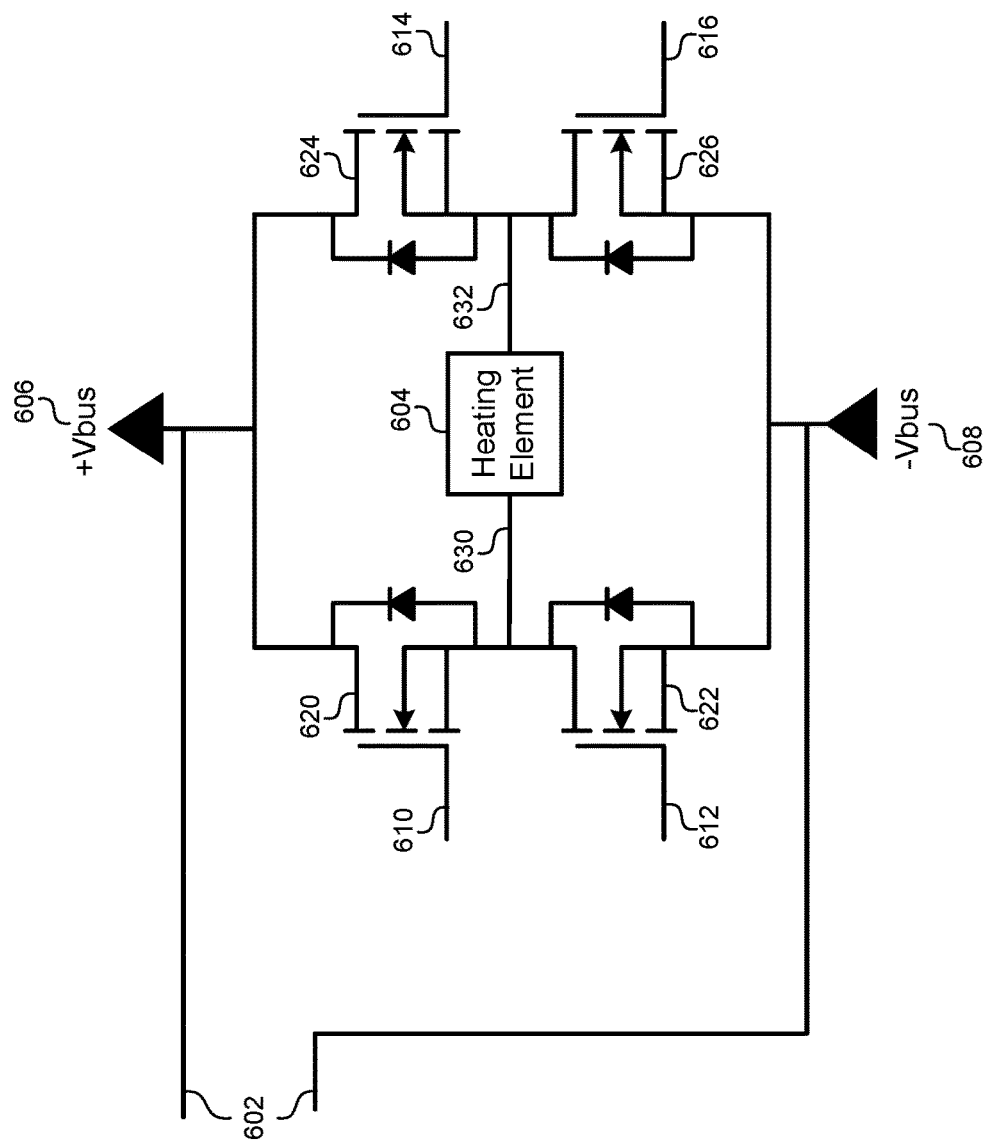
FIG. 6 illustrates a switching circuit configured to switch the polarity of the DC voltage applied to the heating element, according to some embodiments.

FIG. 6 illustrates a switching circuit configured to switch the polarity of the DC voltage applied to the heating element, according to some embodiments. The plurality of switches may be implemented using low on-resistance MOSFETs or other similar power switches. As described above, some processing chambers may use bipolar chucking, which relies on a voltage differential applied across the pedestal 104 to hold the substrate 154 to the pedestal 104. However, when multiple heating elements are embedded in the pedestal 104, and DC voltages are applied to these individual heating elements, this additional voltage may disturb the voltage differential used for bipolar chucking.

In order to overcome the problems caused by applying heating voltages to different heating zones in the pedestal 104, the switching circuit illustrated in FIG. 6 may periodically reverse the polarity of the voltage applied to the different heating zones. In this example, a single switching circuit is illustrated for a single heating element 604. The voltage received from the circuit in FIG. 5 may be used to generate a high voltage reference 606 and a low voltage reference 608 (e.g., +Vbus and −Vbus, Vdd and ground, a positive voltage and a negative voltage, etc.). In order to apply a voltage with a first polarity, control signals may be received from a controller (such as a microcontroller, a microprocessor, or other control logic) to switch the plurality of switches accordingly.

For example, to apply a positive voltage between a power lead 630 and a return lead 632 of the heating element 604, the controller may provide signals 610, 616 to turn on switches 620, 626. The controller may also provide signals 612, 614 to turn off switches 622, 624. This creates a first circuit pathway from the high-voltage reference 606, through switch 620, through the power lead 630, through the heating element 604, through the return lead 632, through switch 626, to the low voltage reference 608. To switch the polarity of the voltage applied to the heating element 604, the controller may provide signals 610, 616 to turn off switches 620, 626. The controller may also provide signals 612, 614 to turn on switches 622, 624. This creates a second circuit pathway from the low-voltage reference 608, through switch 622, through the power lead 630, through the heating element 604, through the return lead 632, through switch 624, to the high-voltage reference 606.

The controller may provide these alternating signals 610, 612, 614, 616 to control the switches 620, 622, 624, 626 as described above at a predetermined frequency. For example, frequencies between approximately 50 Hz and approximately 100 Hz may be used to switch the polarity of the applied voltages to the heating element. This frequency range has been found to be sufficient such that the voltages applied in different locations in the pedestal 104 to the various heating elements do not interfere with the bipolar chucking. For example, some embodiments have used a frequency between approximately 50 Hz and approximately 60 Hz.

Figure 7:
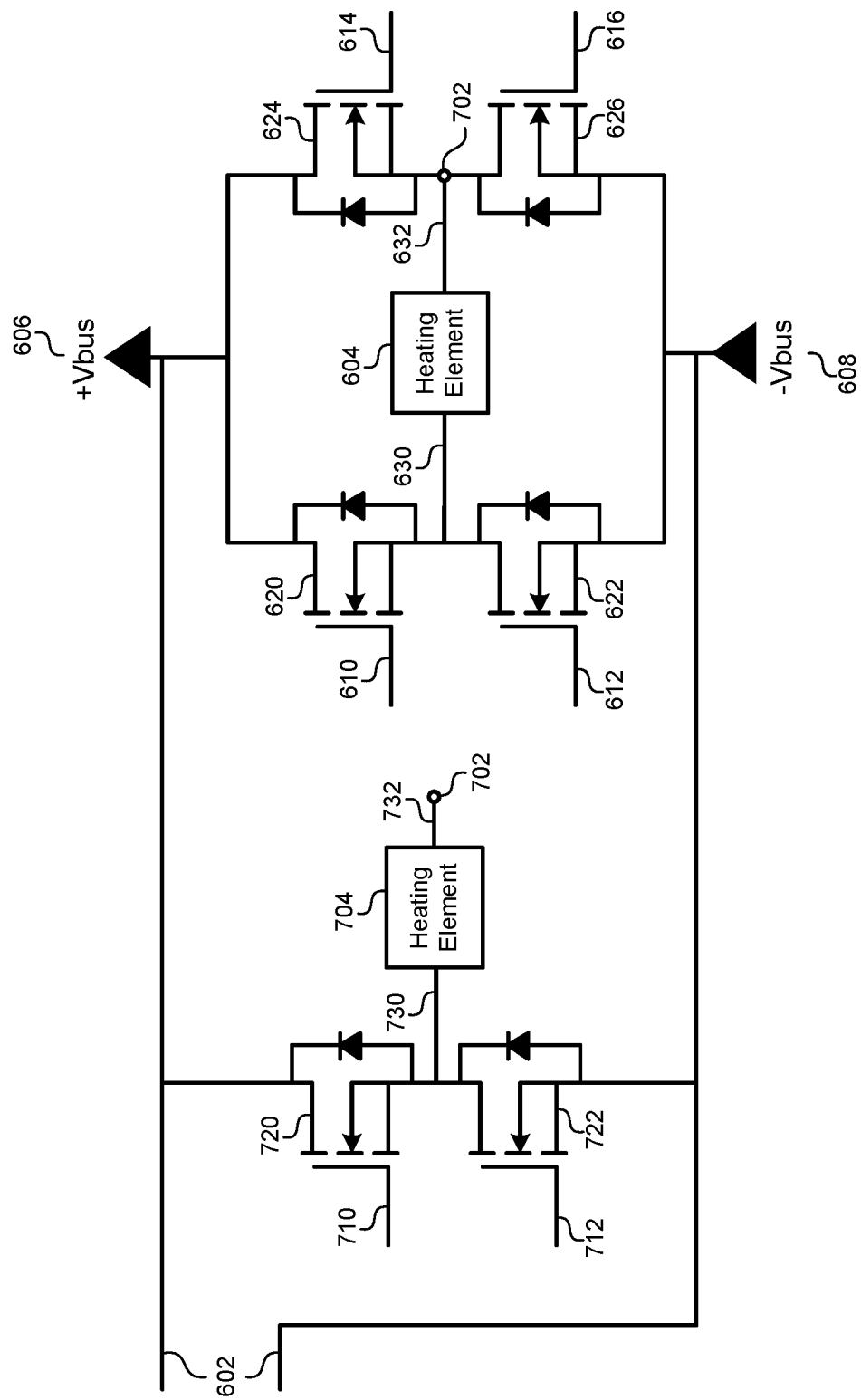
FIG. 7 illustrates a combination of switching circuits for heating elements that share a return wire, according to some embodiments.

FIG. 7 illustrates a combination of switching circuits for heating elements that share a return wire, according to some embodiments. In some embodiments, the switching circuit illustrated in FIG. 7 may be repeated for each of the individual heating element when dedicated return wires are used. When shared return wires are used, the left-hand side of the switching circuit may be duplicated for each separate heating element, while the right-hand side of the switching circuit may be shared between each of the heating elements that shares a return wire.

For example, the switches 620, 622, 624, 626 may operate as described above for heating element 604. For heating element 704 that shares a return lead with heating element 604, switches 720, 722 may be controlled by signals 710, 712. To apply positive voltage across heating element 704, switch 720 may be turned on, while turning on switch 722 may apply a voltage having a reversed polarity across heating element 704. The return lead 732 for heating element 704 may be connected to node 702, which is shared with the return lead 632 of heating element 604. This allows the timing of heating element 704 to be controlled individually while sharing a return lead with heating element 604. Note that the circuit for heating element 704 may be duplicated for each heating element sharing the same return lead.

In some embodiments, the circuit of FIG. 6 may be duplicated for each heating element while still sharing a return lead. For example, the return lead may be connected to each individual switching circuit after the return lead exits the pedestal 104. Either option may be used in any combination and without limitation.

Figure 8:
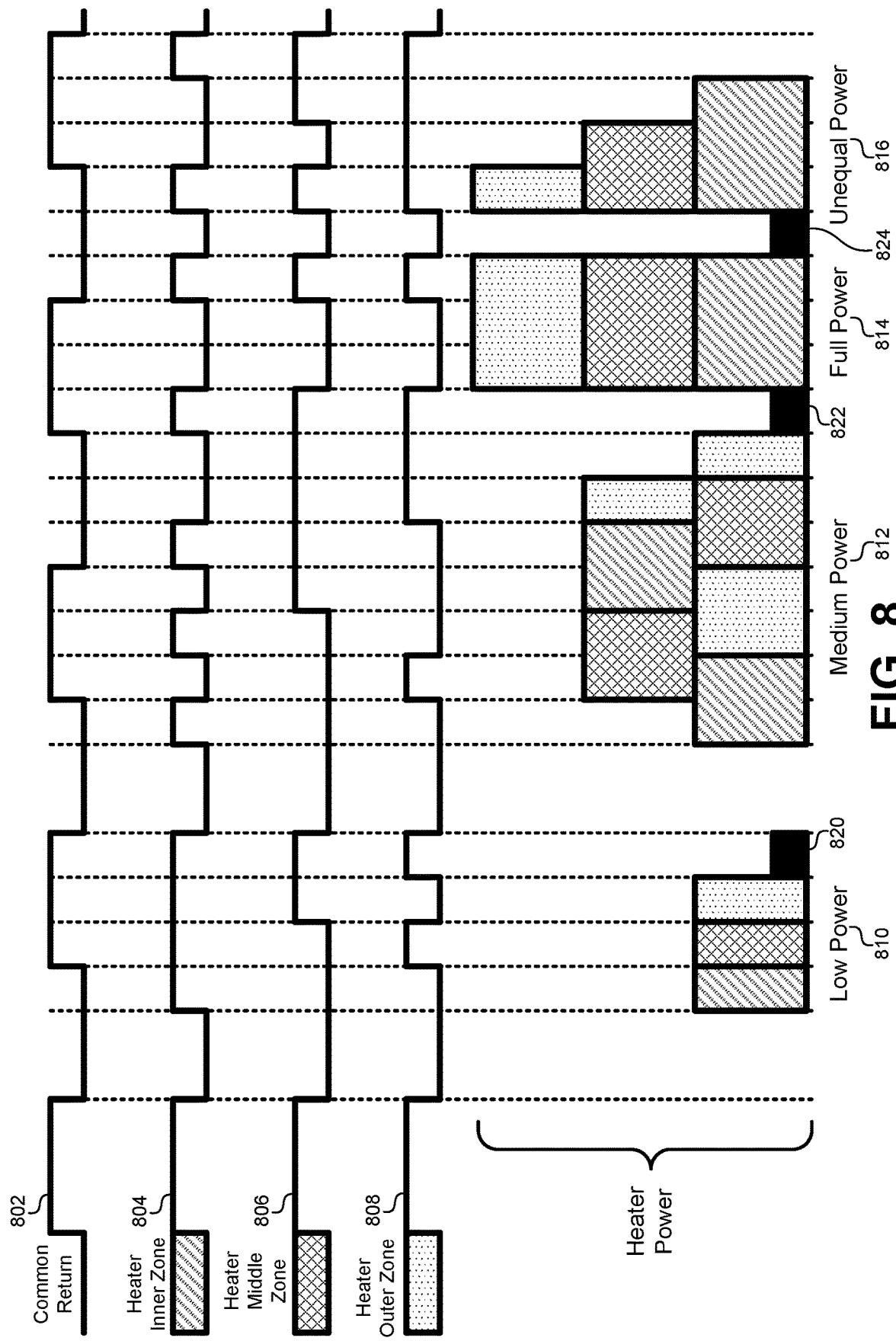
FIG. 8 illustrates a timing diagram for controlling multiple high-power heating zones, according to some embodiments.

FIG. 8 illustrates a timing diagram for controlling multiple high-power heating zones, according to some embodiments. Although sharing a return lead reduces the number of leads routed through the pedestal 104, it may also increase the instantaneous current routed through the return lead when multiple heating elements operate at the same time. To solve this problem, the embodiments described herein may use a heater control that duty cycles the heating elements that share return leads. This duty cycling may minimize the number of heating elements that are active at one time with a shared return lead, thereby minimizing the instantaneous power routed through the shared return lead.

Control signals are illustrated for each of the three high-power heating zones. These control signals should not be confused with the control signals in FIG. 6 and FIG. 7 for controlling individual switches. Instead, these control signals indicate when a voltage is being applied to the heating element. During each time interval when a voltage is applied, the voltage polarity may be switched at a predetermined frequency (e.g., 50 Hz) during that time interval. When a control signal for a heating zone is the same as the control signal for the common return, the heating element will be turned off. When the control signal for the heating zone is different from the common return, the corresponding heating element will be turned on.

When all of the signals 802, 804, 806, 808 are the same, none of the heating elements will be turned on. During a low-power mode 810, one of the heating elements may turn on at a time for approximately 25% of the duty cycle. For example, when the common return signal 802 is low and the inner heating zone signal 804 is high, the inner heating zone will be active. When the common return signal 802 switches to high, the inner heating zone will be inactive and the middle heating zone may be active, and so forth.

This low-power mode 810 may divide the cycle period into four time intervals. The first three time intervals may be approximately equal, and they may be assigned to each of the three heating zones. The fourth time interval may be longer/shorter than the other three time intervals, and may be used to measure the resistance of the heating element described below. During cycles when no measurement is needed, the duty cycle may instead be divided into three approximately equal time intervals assigned to each of the three heating zones. Alternatively, some embodiments may assign longer/shorter intervals to individual heating zones to alter the temperature curve. For example, the inner heating zone may be assigned a longer duty cycle to increase the temperature in the center of the pedestal relative to the periphery of the pedestal.

In a medium-power mode 812, multiple heating zones may be allowed to overlap in their operational duty cycles. As illustrated in FIG. 8, two heating zones may be active at a time. Two complete cycles through the different heating zones may be completed before an interval 822 where each of the heating zones are turned off for a resistance measurement. Note that all of the zones that share a return lead may be turned off during the measurement to ensure that the measurements on those power leads are accurate. Similarly, a full-power mode 814 may activate all of the heating zones simultaneously. All of the heating zones may be turned off when a measurement interval 824 is needed.

The controller may alter the operating mode between low-power, medium-power, and full-power during operation of the processing chamber in response to measured temperatures in the pedestal. For example, the controller may switch from low-power mode 810 into a full-power mode 814 in order to initially heat the pedestal 104. In addition to altering the duty cycle for individual heating zones, some embodiments may apply unequal power 816 that allows individual heating zones to use different duty cycles and overlap their operation times as needed. This allows more power to be provided to an individual heating zone without shortening the operating interval of another heating zone.

Figure 9:
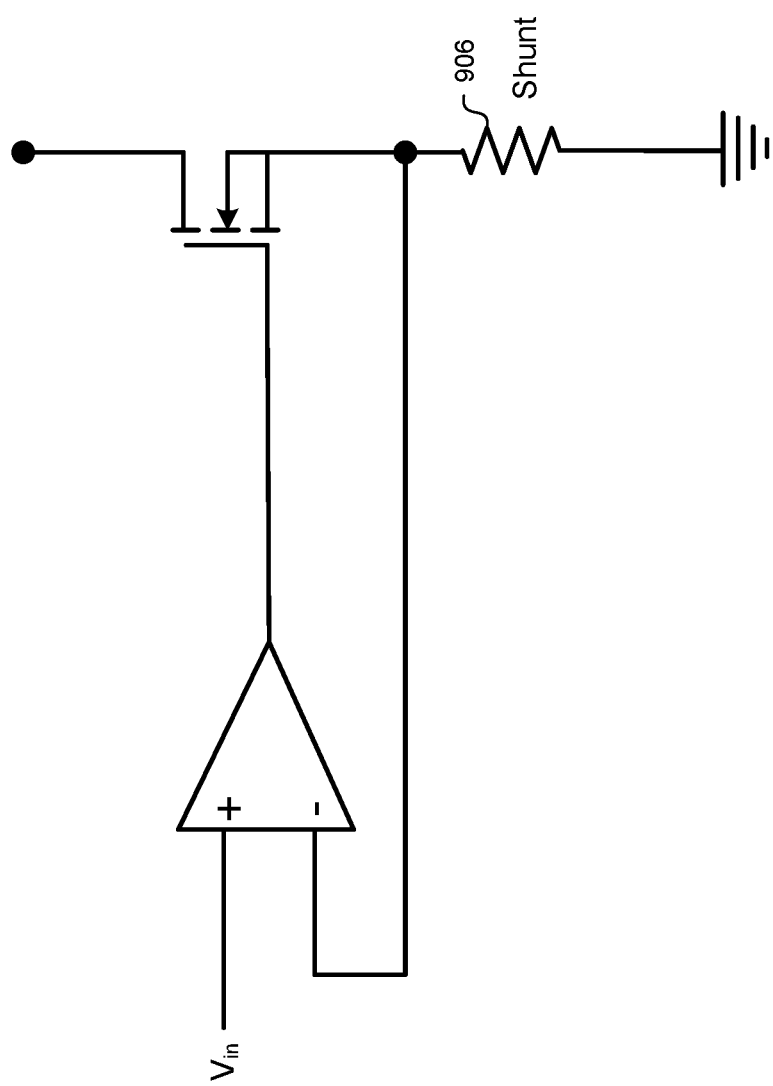
FIG. 9 illustrates a circuit for measuring the resistance of a heating element for determining an instantaneous temperature, according to some embodiments.

FIG. 9 illustrates a circuit for measuring the resistance of a heating element for determining an instantaneous temperature in a heating element, according to some embodiments. As described above, the duty cycling of individual heating elements may be governed such that measurement intervals are available during which none of the heating zones are active for a shared return lead. During this time, each of the individual heating elements may be measured to determine their resistance. This sensor illustrated in FIG. 9 may be positioned on each power line next to the RF filter to eliminate any added resistance of an additional interconnect. This measurement circuit may be placed on the common return rod, and the circuit may sequentially measure each heating element that shares the common return rod. For example, the approximate time needed to measure all heating elements on one rod may be less than 10 ms. If more than one rod is present, the measurements can be done at the same time on each rod. In other embodiments, the circuit in FIG. 9 may be connected to each of the power leads connected to the various heating elements.

Any associated diode bridges may be turned off to isolate the circuit from the AC power source. A calibrated current may be provided from the constant current source circuit in FIG. 9. The resulting voltage may be measured over the leads of each of the heating element. A high precision shunt 906 may be used (e.g., 0.1 ohm) such that the resistance in the heating element may be measured. The resistance of the heating element may change with temperature. Generally, a linear relationship between temperature and resistance may exist in the heating element, and the resistance that is measured may be used to calculate a precise temperature in the heating element. For example, a typical relationship may exhibit a 0.5 ohm/100° C. slope. The voltage/current recorded during each measurement may thus be used to calculate a resistance, which may then be used to calculate a temperature.

Sampling the temperature may be less than approximately 10 ms. The sampling interval may be between approximately 100 milliseconds and approximately 500 ms. Waiting too long to sample the resistance/temperature may allow the temperature to drift too much in the pedestal, while sampling too frequently may reduce the time that the heating elements are energized more than is necessary. The measured resistances may be used to populate a table in the controller that calibrates the temperature calculation. This allows the controller to self-calibrate the operation of the multiple heating elements. Note that this eliminates active heating during measurements that could otherwise result in a temperature offset. If resistance measurements occur during active heating, the heating element may be at a higher temperature than the heater. This method instead measures resistance when the heating element is off, thus improving the accuracy of the measurement.

Figure 10:
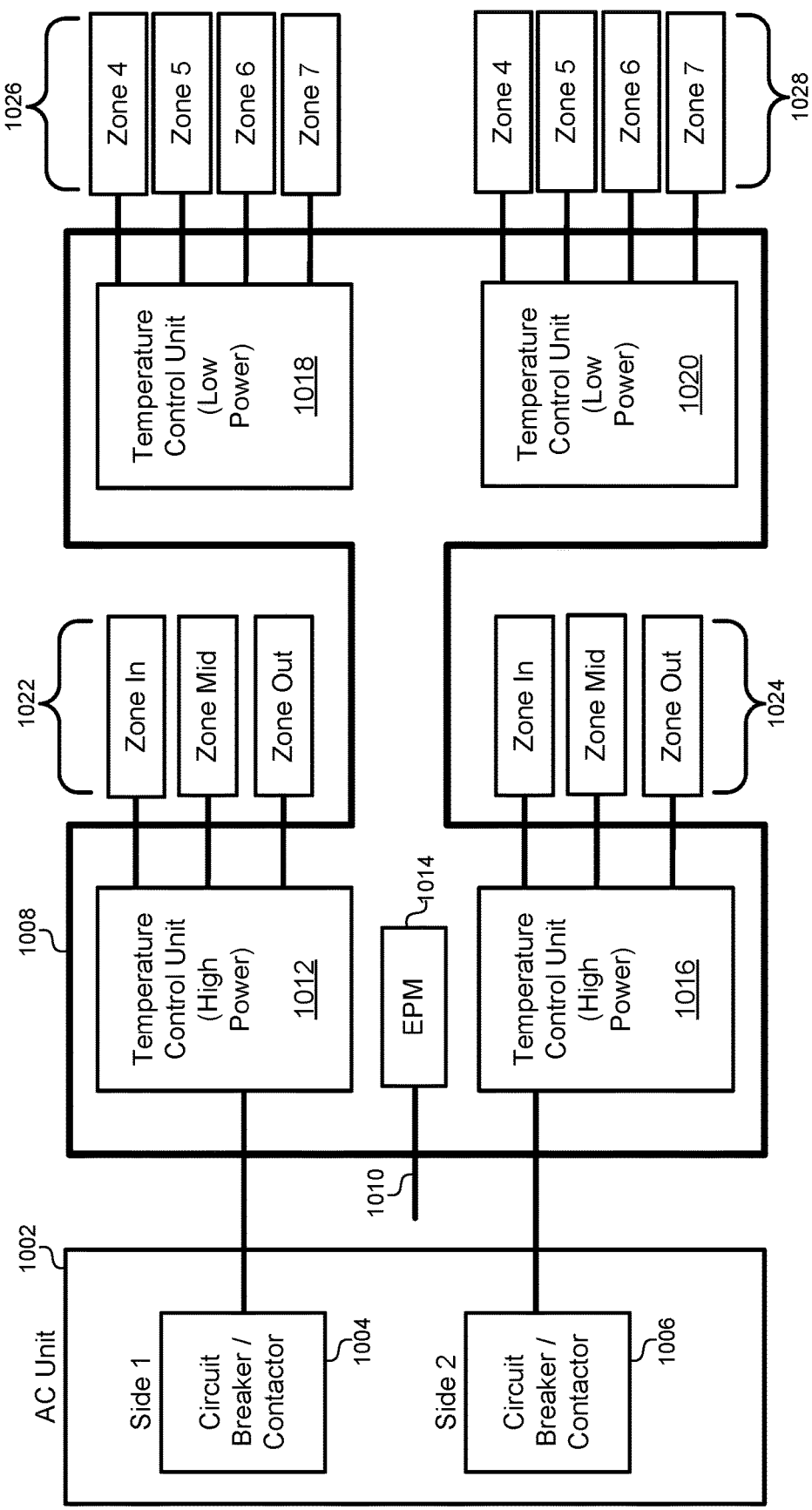
FIG. 10 illustrates a system diagram for a heater control with multiple zone controls, according to some embodiments.

FIG. 10 illustrates a system diagram for a heater control with multiple zone controls, according to some embodiments. The heater control may include an AC unit 1002 that includes a plurality of individual power supply interfaces 1004, 1006. Each of these power supply interfaces 1004, 1006 may include circuit breakers, contactors, and/or other interface circuitry for connecting to 3-phase power supplies. The AC unit 1002 may provide 3-phase power to a plurality of temperature control units. Each of the temperature control units may be organized as illustrated by the temperature control unit 301 illustrated in FIG. 3. A communication interface 1014 may receive serial commands 1010 for controlling each of the temperature control units 1012, 1016, 1018, 1020 over, for example, and EtherCAT port.

Each of the temperature control units 1012, 1016, 1018, 1020 may be connected to a plurality of power leads and a shared return lead for controlling multiple zones having similar power requirements. For example, temperature control unit 1012 and temperature control unit 1016 may both provide outputs for inner, middle, and outer heating elements 1022, 1024 in a high-power configuration. Similarly, temperature control unit 1018 and temperature control unit 1020 may both provide outputs for four low-power heating elements 1026, 1028 that may be arranged around a periphery of different pedestals as illustrated in FIG. 2.

The system in FIG. 10 may be used to control multiple zones in multiple pedestals. Turning back briefly to FIG. 5, the transformer 508 step up/down the DC signal received from the 3-phase rectifier 504 to isolate the power leads from the 3-phase voltage source 502. After passing through the transformer 508, one or more DC converters may derive or convert the DC signal received from the 3-phase rectifier 504 into one or more different power levels. The transformer 508 may be an incorporated part of a DC/DC converter as described above. For example, a high-power level may provide a voltage/current to supply high-power heating elements with more than 1 kW of power. A low-power level may provide a voltage/current to supply low-power heating elements with less than 100 W of power. Thus, the same heating system may include a first temperature control unit 1012 connected to a first plurality of power leads to supply high-power heating elements 1022, as well as a second temperature control unit 1018 connected to a second plurality of power leads to supply low-power heating elements 1026. The same serial communication interface 1014 may provide commands to control both of these temperature control units 1012, 1018.

Figure 11:
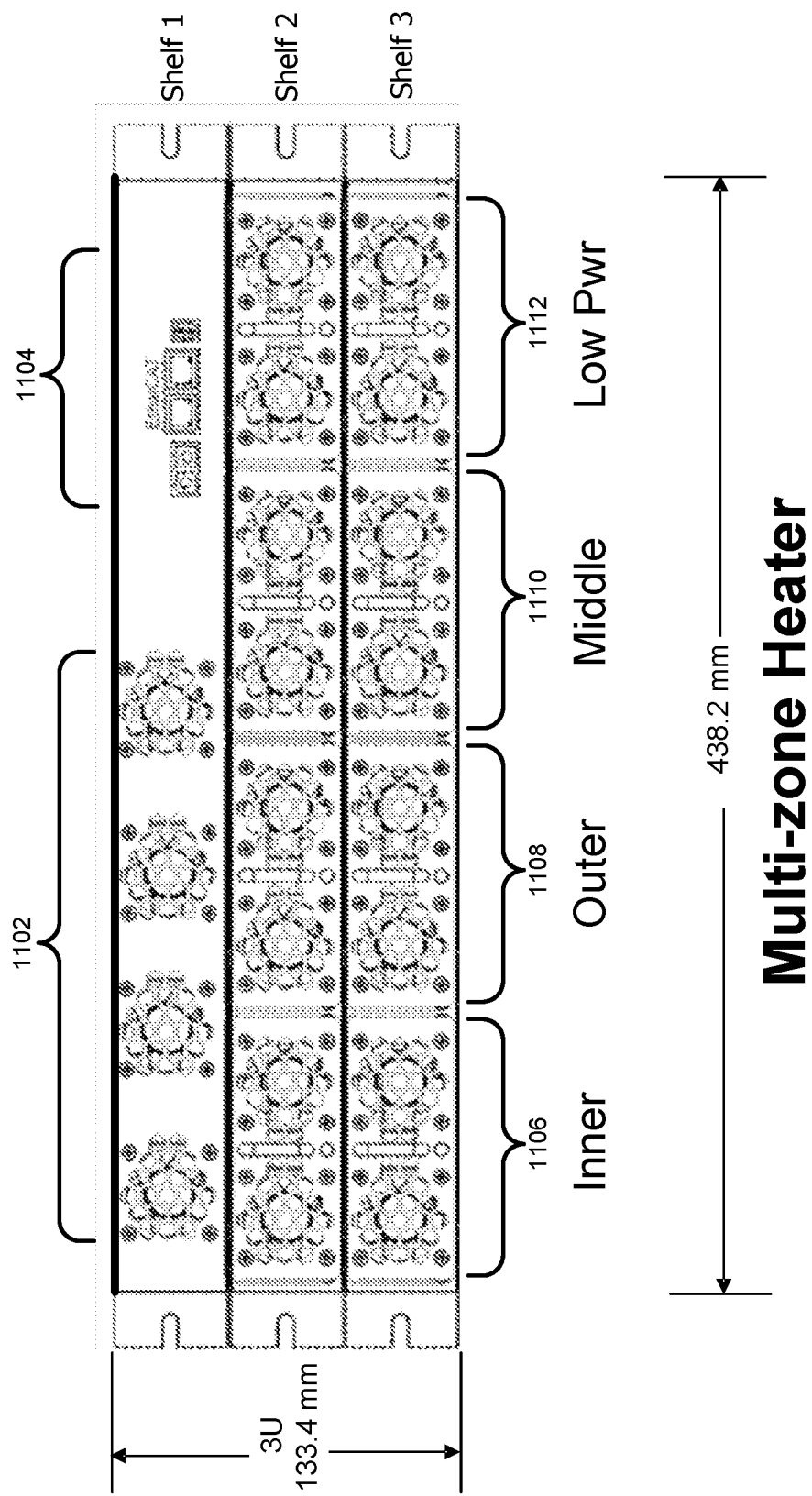
FIG. 11 illustrates how the different AC units and temperature control modules in FIG. 10 may be provided in any combination in a rack unit, according to some embodiments.

FIG. 11 illustrates how the different AC units and temperature control modules in FIG. 10 may be provided in any combination in a rack unit, according to some embodiments. Shelf 1 may include a number of AC units 1102 and an EtherCAT port 1104. Shelf 2 and shelf 3 may include different high-power and low-power temperature control modules in any combination. Modules may be inserted in different shelf locations as needed in a plug-and-play fashion. For example, modules may be inserted at the time of manufacturing or later after installation when the heater is being upgraded or serviced.

Figure 12:
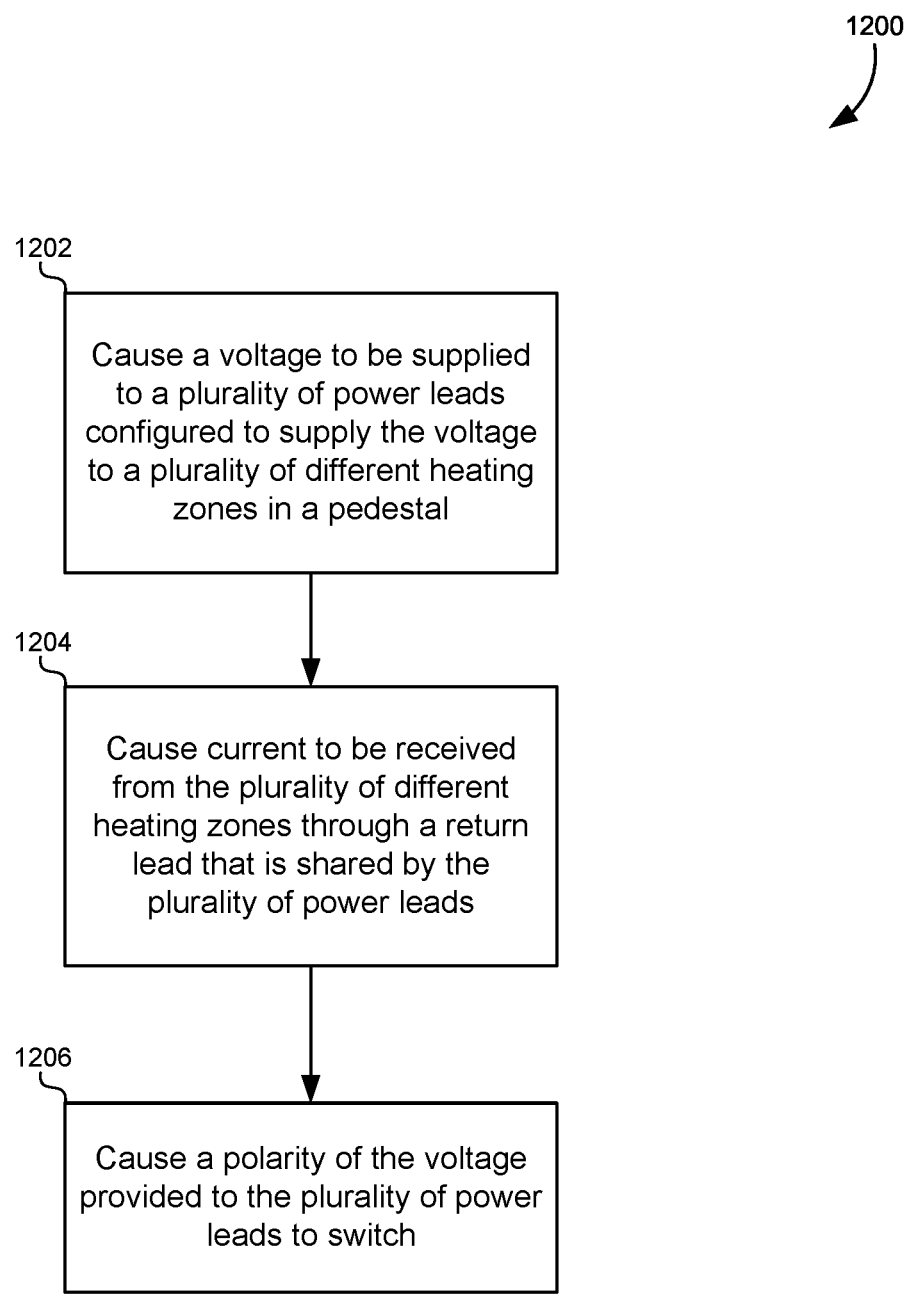
FIG. 12 illustrates a method of providing power to a plurality of heating elements in a plurality of heating zones for wafer-processing equipment.

FIG. 12 illustrates a method of providing power to a plurality of heating elements in a plurality of heating zones for wafer-processing equipment. This method may be carried out by the control unit that generates the signals controlling the switches for the switching circuits illustrated above in FIG. 6 in FIG. 7. This method may also be carried out by a computing device described below in FIG. 13 that may provide such signals or corresponding commands that cause the switches to operate and provide/switch voltage polarities to the heaters. Portions of this method may also be carried out in part by various circuit elements described in FIG. 3.

The method may include causing a voltage to be supplied to a plurality of power leads configured to supply power to a plurality of different heating zones in a pedestal (1202). Supplying the voltage may include supplying a voltage of a polarity (e.g., a positive polarity) to each of the power leads. The power dissipated in the heating element may be a function of the voltage applied and the internal resistance of the heating element. Power may be duty cycled as described above in FIG. 8. Power may be provided as high-power signals (e.g., greater than 1 kW) and/or as low-power signals (less than 100 W). The different heating zones may include high-power inner, middle, and outer zones, as well as low-power peripheral zones as illustrated above in FIG. 2. In some embodiments, the method may also include turning off power to all of the plurality of power leads inward to measure a resistance of each of the power leads. A computer system may cause these power signals to be sent by generating commands through an EtherCAT connection that is translated into control signals that operate the gates of the transistors described above. Control logic may additionally or alternatively cause these power signals to be sent by generating similar control signals.

The method may additionally include causing current to be received from the plurality of different heating zones through a return lead that is shared by the plurality of power leads (1204). The shared return lead may be implemented as described above in FIG. 4, as well as FIG. 6 in FIG. 7. The method may further include causing a polarity of a voltage provided to the plurality of power leads to switch (1206). The frequency at which this polarity is switched may be between approximately 50 Hz and approximately 100 Hz as described above. The switching polarity may be governed by the switches as illustrated in FIG. 6 in FIG. 7.

It should be appreciated that the specific steps illustrated in FIG. 12 provide particular methods of providing power to a plurality of heating elements in a plurality of heating zones for wafer-processing equipment according to various embodiments. Other sequences of steps may also be performed according to alternative embodiments. For example, alternative embodiments may perform the steps outlined above in a different order. Moreover, the individual steps illustrated in FIG. 12 may include multiple sub-steps that may be performed in various sequences as appropriate to the individual step. Furthermore, additional steps may be added or removed depending on the particular applications. Many variations, modifications, and alternatives also fall within the scope of this disclosure.

Each of the methods described herein may be implemented by a computer system. Each step of these methods may be executed automatically by the computer system, and/or may be provided with inputs/outputs involving a user. For example, a user may provide inputs for each step in a method, and each of these inputs may be in response to a specific output requesting such an input, wherein the output is generated by the computer system. Each input may be received in response to a corresponding requesting output. Furthermore, inputs may be received from a user, from another computer system as a data stream, retrieved from a memory location, retrieved over a network, requested from a web service, and/or the like. Likewise, outputs may be provided to a user, to another computer system as a data stream, saved in a memory location, sent over a network, provided to a web service, and/or the like. In short, each step of the methods described herein may be performed by a computer system, and may involve any number of inputs, outputs, and/or requests to and from the computer system which may or may not involve a user. Those steps not involving a user may be said to be performed automatically by the computer system without human intervention. Therefore, it will be understood in light of this disclosure, that each step of each method described herein may be altered to include an input and output to and from a user, or may be done automatically by a computer system without human intervention where any determinations are made by a processor. Furthermore, some embodiments of each of the methods described herein may be implemented as a set of instructions stored on a tangible, non-transitory storage medium to form a tangible software product.

Figure 13:
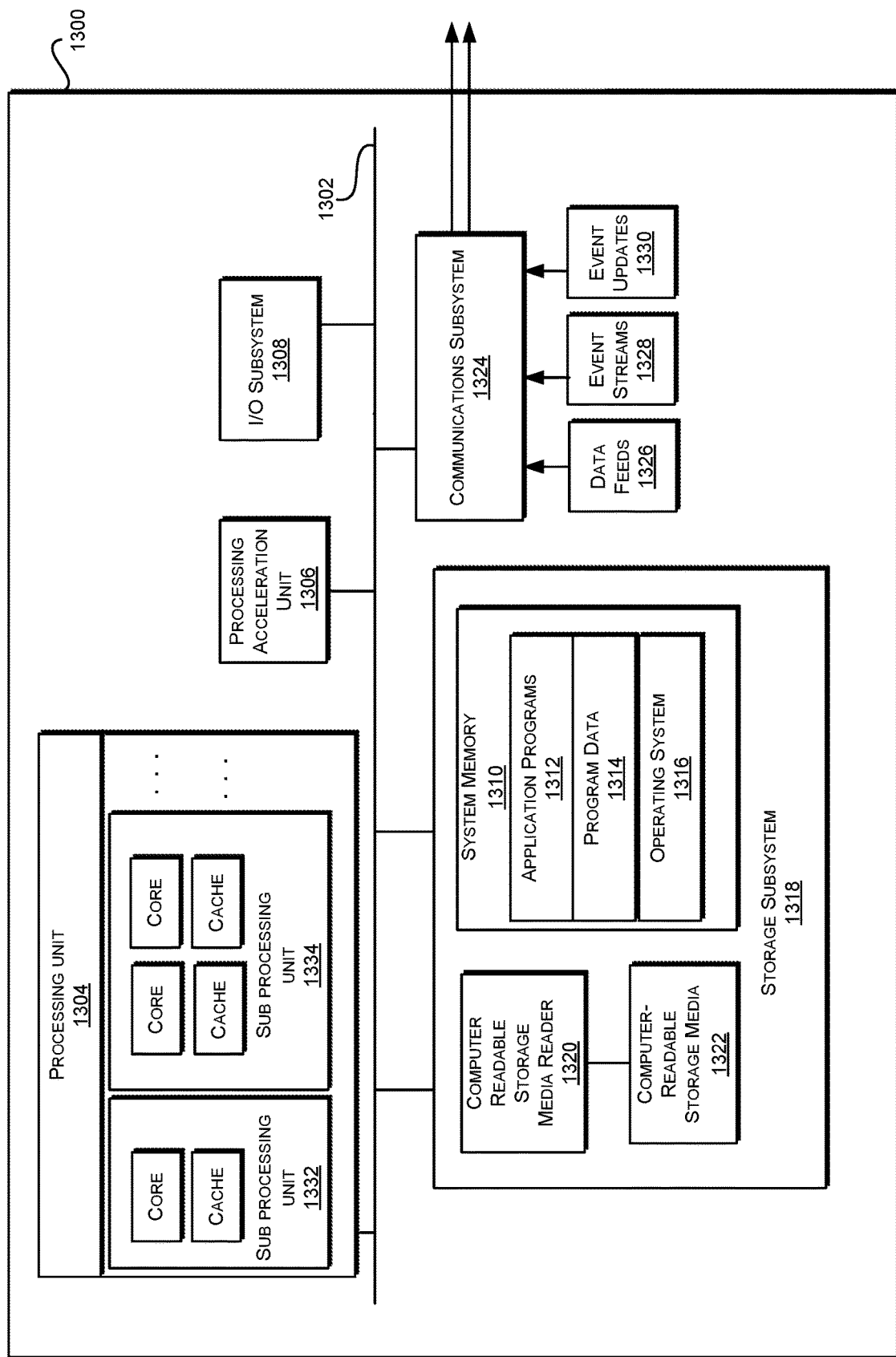
FIG. 13 illustrates an exemplary computer system, in which various embodiments may be implemented.

FIG. 13 illustrates an exemplary computer system 1300, in which various embodiments may be implemented. The system 1300 may be used to implement any of the computer systems described above. As shown in the figure, computer system 1300 includes a processing unit 1304 that communicates with a number of peripheral subsystems via a bus subsystem 1302. These peripheral subsystems may include a processing acceleration unit 1306, an I/O subsystem 1308, a storage subsystem 1318 and a communications subsystem 1324. Storage subsystem 1318 includes tangible computer-readable storage media 1322 and a system memory 1310.

Bus subsystem 1302 provides a mechanism for letting the various components and subsystems of computer system 1300 communicate with each other as intended. Although bus subsystem 1302 is shown schematically as a single bus, alternative embodiments of the bus subsystem may utilize multiple buses. Bus subsystem 1302 may be any of several types of bus structures including a memory bus or memory controller, a peripheral bus, and a local bus using any of a variety of bus architectures. For example, such architectures may include an Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus, which can be implemented as a Mezzanine bus manufactured to the IEEE P1386.1 standard.

Processing unit 1304, which can be implemented as one or more integrated circuits (e.g., a conventional microprocessor or microcontroller), controls the operation of computer system 1300. One or more processors may be included in processing unit 1304. These processors may include single core or multicore processors. In certain embodiments, processing unit 1304 may be implemented as one or more independent processing units 1332 and/or 1334 with single or multicore processors included in each processing unit. In other embodiments, processing unit 1304 may also be implemented as a quad-core processing unit formed by integrating two dual-core processors into a single chip.

In various embodiments, processing unit 1304 can execute a variety of programs in response to program code and can maintain multiple concurrently executing programs or processes. At any given time, some or all of the program code to be executed can be resident in processor(s) 1304 and/or in storage subsystem 1318. Through suitable programming, processor(s) 1304 can provide various functionalities described above. Computer system 1300 may additionally include a processing acceleration unit 1306, which can include a digital signal processor (DSP), a special-purpose processor, and/or the like.

I/O subsystem 1308 may include user interface input devices and user interface output devices. User interface input devices may include a keyboard, pointing devices such as a mouse or trackball, a touchpad or touch screen incorporated into a display, a scroll wheel, a click wheel, a dial, a button, a switch, a keypad, audio input devices with voice command recognition systems, microphones, and other types of input devices. User interface input devices may include, for example, motion sensing and/or gesture recognition devices such as the Microsoft Kinect® motion sensor that enables users to control and interact with an input device, such as the Microsoft Xbox® 360 game controller, through a natural user interface using gestures and spoken commands. User interface input devices may also include eye gesture recognition devices such as the Google Glass® blink detector that detects eye activity (e.g., 'blinking' while taking pictures and/or making a menu selection) from users and transforms the eye gestures as input into an input device (e.g., Google Glass®). Additionally, user interface input devices may include voice recognition sensing devices that enable users to interact with voice recognition systems (e.g., Siri® navigator), through voice commands.

User interface input devices may also include, without limitation, three dimensional (3D) mice, joysticks or pointing sticks, gamepads and graphic tablets, and audio/visual devices such as speakers, digital cameras, digital camcorders, portable media players, webcams, image scanners, fingerprint scanners, barcode reader 3D scanners, 3D printers, laser rangefinders, and eye gaze tracking devices. Additionally, user interface input devices may include, for example, medical imaging input devices such as computed tomography, magnetic resonance imaging, position emission tomography, medical ultrasonography devices. User interface input devices may also include, for example, audio input devices such as MIDI keyboards, digital musical instruments and the like.

User interface output devices may include a display subsystem, indicator lights, or non-visual displays such as audio output devices, etc. The display subsystem may be a cathode ray tube (CRT), a flat-panel device, such as that using a liquid crystal display (LCD) or plasma display, a projection device, a touch screen, and the like. In general, use of the term "output device" is intended to include all possible types of devices and mechanisms for outputting information from computer system 1300 to a user or other computer. For example, user interface output devices may include, without limitation, a variety of display devices that visually convey text, graphics and audio/video information such as monitors, printers, speakers, headphones, automotive navigation systems, plotters, voice output devices, and modems.

Computer system 1300 may comprise a storage subsystem 1318 that comprises software elements, shown as being currently located within a system memory 1310. System memory 1310 may store program instructions that are loadable and executable on processing unit 1304, as well as data generated during the execution of these programs.

Depending on the configuration and type of computer system 1300, system memory 1310 may be volatile (such as random access memory (RAM)) and/or non-volatile (such as read-only memory (ROM), flash memory, etc.) The RAM typically contains data and/or program modules that are immediately accessible to and/or presently being operated and executed by processing unit 1304. In some implementations, system memory 1310 may include multiple different types of memory, such as static random access memory (SRAM) or dynamic random access memory (DRAM). In some implementations, a basic input/output system (BIOS), containing the basic routines that help to transfer information between elements within computer system 1300, such as during start-up, may typically be stored in the ROM. By way of example, and not limitation, system memory 1310 also illustrates application programs 1312, which may include client applications, Web browsers, mid-tier applications, relational database management systems (RDBMS), etc., program data 1314, and an operating system 1316. By way of example, operating system 1316 may include various versions of Microsoft Windows®, Apple Macintosh®, and/or Linux operating systems, a variety of commercially-available UNIX® or UNIX-like operating systems (including without limitation the variety of GNU/Linux operating systems, the Google Chrome® OS, and the like) and/or mobile operating systems such as iOS, Windows® Phone, Android® OS, BlackBerry® 10 OS, and Palm® OS operating systems.

Storage subsystem 1318 may also provide a tangible computer-readable storage medium for storing the basic programming and data constructs that provide the functionality of some embodiments. Software (programs, code modules, instructions) that when executed by a processor provide the functionality described above may be stored in storage subsystem 1318. These software modules or instructions may be executed by processing unit 1304. Storage subsystem 1318 may also provide a repository for storing data used in accordance with some embodiments.

Storage subsystem 1300 may also include a computer-readable storage media reader 1320 that can further be connected to computer-readable storage media 1322. Together and, optionally, in combination with system memory 1310, computer-readable storage media 1322 may comprehensively represent remote, local, fixed, and/or removable storage devices plus storage media for temporarily and/or more permanently containing, storing, transmitting, and retrieving computer-readable information.

Computer-readable storage media 1322 containing code, or portions of code, can also include any appropriate media, including storage media and communication media, such as but not limited to, volatile and non-volatile, removable and non-removable media implemented in any method or technology for storage and/or transmission of information. This can include tangible computer-readable storage media such as RAM, ROM, electronically erasable programmable ROM (EEPROM), flash memory or other memory technology, CD-ROM, digital versatile disk (DVD), or other optical storage, magnetic cassettes, magnetic tape, magnetic disk storage or other magnetic storage devices, or other tangible computer readable media. This can also include nontangible computer-readable media, such as data signals, data transmissions, or any other medium which can be used to transmit the desired information and which can be accessed by computing system 1300.

By way of example, computer-readable storage media 1322 may include a hard disk drive that reads from or writes to non-removable, nonvolatile magnetic media, a magnetic disk drive that reads from or writes to a removable, non-volatile magnetic disk, and an optical disk drive that reads from or writes to a removable, nonvolatile optical disk such as a CD ROM, DVD, and Blu-Ray® disk, or other optical media. Computer-readable storage media 1322 may include, but is not limited to, Zip® drives, flash memory cards, universal serial bus (USB) flash drives, secure digital (SD) cards, DVD disks, digital video tape, and the like. Computer-readable storage media 1322 may also include, solid-state drives (SSD) based on non-volatile memory such as flash-memory based SSDs, enterprise flash drives, solid state ROM, and the like, SSDs based on volatile memory such as solid state RAM, dynamic RAM, static RAM, DRAM-based SSDs, magnetoresistive RAM (MRAM) SSDs, and hybrid SSDs that use a combination of DRAM and flash memory based SSDs. The disk drives and their associated computer-readable media may provide non-volatile storage of computer-readable instructions, data structures, program modules, and other data for computer system 1300.

Communications subsystem 1324 provides an interface to other computer systems and networks. Communications subsystem 1324 serves as an interface for receiving data from and transmitting data to other systems from computer system 1300. For example, communications subsystem 1324 may enable computer system 1300 to connect to one or more devices via the Internet. In some embodiments communications subsystem 1324 can include radio frequency (RF) transceiver components for accessing wireless voice and/or data networks (e.g., using cellular telephone technology, advanced data network technology, such as 3G, 4G or EDGE (enhanced data rates for global evolution), WiFi (IEEE 802.11 family standards, or other mobile communication technologies, or any combination thereof), global positioning system (GPS) receiver components, and/or other components. In some embodiments communications subsystem 1324 can provide wired network connectivity (e.g., Ethernet) in addition to or instead of a wireless interface.

In some embodiments, communications subsystem 1324 may also receive input communication in the form of structured and/or unstructured data feeds 1326, event streams 1328, event updates 1330, and the like on behalf of one or more users who may use computer system 1300.

By way of example, communications subsystem 1324 may be configured to receive data feeds 1326 in real-time from users of social networks and/or other communication services such as Twitter® feeds, Facebook® updates, web feeds such as Rich Site Summary (RSS) feeds, and/or real-time updates from one or more third party information sources.

Additionally, communications subsystem 1324 may also be configured to receive data in the form of continuous data streams, which may include event streams 1328 of real-time events and/or event updates 1330, that may be continuous or unbounded in nature with no explicit end. Examples of applications that generate continuous data may include, for example, sensor data applications, financial tickers, network performance measuring tools (e.g. network monitoring and traffic management applications), clickstream analysis tools, automobile traffic monitoring, and the like.

Communications subsystem 1324 may also be configured to output the structured and/or unstructured data feeds 1326, event streams 1328, event updates 1330, and the like to one or more databases that may be in communication with one or more streaming data source computers coupled to computer system 1300.

Computer system 1300 can be one of various types, including a handheld portable device (e.g., an iPhone® cellular phone, an iPad® computing tablet, a PDA), a wearable device (e.g., a Google Glass® head mounted display), a PC, a workstation, a mainframe, a kiosk, a server rack, or any other data processing system.

Due to the ever-changing nature of computers and networks, the description of computer system 1300 depicted in the figure is intended only as a specific example. Many other configurations having more or fewer components than the system depicted in the figure are possible. For example, customized hardware might also be used and/or particular elements might be implemented in hardware, firmware, software (including applets), or a combination. Further, connection to other computing devices, such as network input/output devices, may be employed. Based on the disclosure and teachings provided herein, other ways and/or methods to implement the various embodiments should be apparent.

Throughout this disclosure, the term "approximately" may be used to describe values that occur within a range of −15% to +15% of the stated value. For example, a capacitance of approximately 100 nF may fall within the range of 85 nF to 115 nF.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

What is claimed is:

1. A multi-zone heater control system for wafer-processing chambers, the system comprising:
    an input for a 3-phase power supply;
    a 3-phase rectifier configured to convert a signal from the 3-phase power supply into a DC signal;
    a first plurality of power leads configured to a provide a first power to a first plurality of heating elements in a pedestal such that current flows through each of the first plurality of heating elements to dissipate the first power, wherein the first power is derived from the DC signal;
    a first return lead that is shared by the first plurality of power leads;
    a second plurality of power leads configured to provide a second power to a second plurality of heating elements in the pedestal, wherein the second power is derived from the DC signal;
    a second return lead that is shared by the second plurality of power leads; and
    a controller configured to cause a polarity of a voltage provided to the first plurality of power leads to switch while still sharing the first return lead such that the current still flows through each of the first plurality of heating elements in a same direction to dissipate the first power.

2. The system of claim 1, further comprising:
    one or more DC converters that convert the DC signal into the first power and the second power; and
    a transformer that is part of the one or more DC converters that isolates the 3-phase rectifier from the first plurality of power leads and the second plurality of power leads.

3. The system of claim 1, further comprising an interface that receives commands for providing the first power and the second power.

4. The system of claim 1, wherein the controller is further configured to switch transistor pairs to cause the polarity of a voltage provided to the first plurality of power leads to switch.

5. The system of claim 1, further comprising a controller configured to duty cycle the first power provided to each of the first plurality of power leads.

6. A multi-zone heater control system for wafer-processing chambers, the system comprising:
    a plurality of power leads configured to supply a voltage to a plurality of different heating elements in a pedestal such that current flows through each of the plurality of different heating elements to generate heat;
    a return lead that is shared by the plurality of power leads;
    a plurality of switches that are configured to switch a polarity of the voltage provided to the plurality of power leads; and
    a controller configured to cause a polarity of a voltage provided to the plurality of power leads and to switch while still sharing the return lead such that the current still flows through each of the plurality of different heating elements in a same direction to generate heat.

7. The system of claim 6, further comprising a plurality of DC chucking leads configured to provide a voltage differential to the pedestal to hold a substrate to the pedestal during a processing operation.

8. The system of claim 7, further a control circuit that provides control signals to the plurality of switches, wherein the control circuit causes the plurality of switches to switch the polarity of the voltage at a frequency that does not interfere with the DC chucking.

9. The system of claim 8, wherein the frequency is between approximately 50 Hz and approximately 100 Hz.

10. The system of claim 6, wherein the plurality of switches comprises a first switch and a second switch, wherein the first switch connects a power lead in the plurality of power leads to a first voltage reference, and the second switch connects the power lead to a second voltage reference.

11. The system of claim 10, wherein the plurality of switches further comprises a third switch and a fourth switch, wherein the third switch connects the return lead to the second voltage reference, and the fourth switch connects the return lead to the first voltage reference.

12. The system of claim 6, wherein the plurality of different heating elements comprises inner, middle, and outer heating elements on the pedestal configured to use more than 1 kW of power.

13. The system of claim 6, wherein the plurality of different heating elements comprises at least four heating elements positioned around a periphery of the pedestal that are configured to use less than 250 W of power.

14. The system of claim 6, further comprising:
a circuit that measures a resistance of a heating element associated with one of the plurality of different heating elements; and
a controller that populates a table that relates temperature in the heating element to resistances measured by the circuit.

15. The system of claim 6, further comprising an RF filter configured to block RF frequencies that are provided to a plasma in a wafer-processing chamber.

16. A method of providing power to a plurality of heaters in multiple zones for wafer-processing equipment, the method comprising:
causing a voltage to be supplied to a plurality of power leads configured to supply the voltage to a plurality of different heating elements in a pedestal such that current flows through each of the plurality of different heating elements to generate heat;
causing current to be received from the plurality of different heating elements through a return lead that is shared by the plurality of power leads; and
causing a polarity of the voltage provided to the plurality of power leads to switch such that the current still flows through each of the plurality of different heating elements in a same direction to generate heat while still sharing the return lead.

17. The method of claim 16, further comprising causing the voltage provided to the plurality of power leads to switch between equal negative and positive voltages.

18. The method of claim 16, further comprising duty cycling each of the plurality of different heating elements in the pedestal such that only one of the plurality of different heating elements are active at a time.

19. The method of claim 18, further comprising duty cycling each of the plurality of different heating elements to provide a time interval during which resistance measurements are made on the plurality of power leads and during which none of the plurality of different heating elements are active.

20. The method of claim 16, further comprising duty cycling each of the plurality of different heating elements in the pedestal such that only two of the plurality of different heating elements are active at a time.

* * * * *